United States Patent [19]

Knight

[11] 3,863,169

[45] Jan. 28, 1975

[54] COMPOSITE TRANSISTOR CIRCUIT

[75] Inventor: Mark Berwyn Knight, N. Caldwell, N.J.

[73] Assignee: RCA Corporation, New York, N.Y.

[22] Filed: Jan. 18, 1974

[21] Appl. No.: 434,375

[52] U.S. Cl. .................... 330/22, 307/299, 307/303, 330/17, 330/19, 330/38 M

[51] Int. Cl. .................... H03f 3/04

[58] Field of Search ........ 307/299, 303; 330/13, 17, 330/19, 22, 38 M, 40

[56] References Cited

UNITED STATES PATENTS

| | | | |
|---|---|---|---|
| 3,531,730 | 9/1970 | Steckler | 330/19 X |
| 3,813,606 | 5/1974 | Sakamoto et al. | 330/38 M X |

*Primary Examiner*—Alfred E. Smith
*Assistant Examiner*—Lawrence J. Dahl
*Attorney, Agent, or Firm*—H. Christoffersen; S. Cohen; A. L. Limberg

[57] ABSTRACT

A circuit exhibiting the characteristics of a transistor suited for use in a quasi-complementary push-pull amplifier uses input and output transistors of the same conductivity type. The "base" electrode of the composite transistor is at the emitter electrode of the input transistor, operated as a common-base amplifier. The collector electrode of the input transistor is coupled by a current mirror amplifier to the base electrode of the output transistor. The "emitter" electrode of the composite transistor is at the joined base electrode of the input transistor and the collector electrode of the output transistor. The "collector" electrode of the composite transistor is at the emitter electrode of the output transistor. The current gain of the composite transistor can be made to be equal to that of the output transistor, although the apparent conductivity type of the composite device is opposite to that of the input and the output transistors.

9 Claims, 3 Drawing Figures

Patented Jan. 28, 1975 3,863,169

2 Sheets-Sheet 1

COMPOSITE TRANSISTOR CIRCUIT

Figure 2:
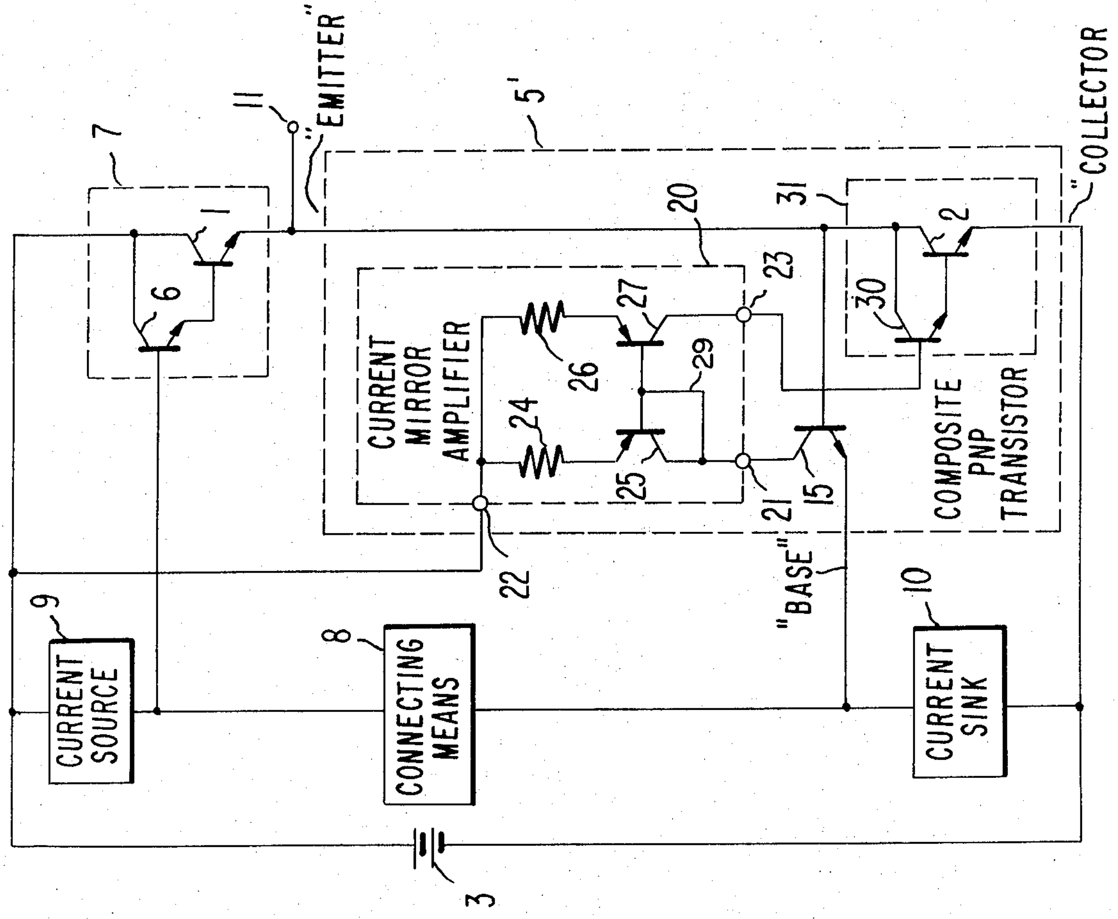

The present invention relates to composite transistors—that is, to circuits containing a plurality of component transistors which together provide the operating characteristics of a superior transistor—and more particularly to composite transistors well adapted for use in quasi-complementary push-pull amplifier circuits.

The basic design of prior art quasi-complementary push-pull transistor amplifiers is described by Hung Chang Lin in U.S. Pat. No. 2,896,029, entitled "SEMICONDUCTOR AMPLIFIER CIRCUITS," issued July 21, 1959 and assigned to RCA Corporation.

A composite transistor embodying an aspect of the present invention comprises a first and a second transistors of the same conductivity type and a current mirror amplifier coupling current from the collector electrode of the first transistor to the base electrode of the second transistor. The equivalent "base" electrode of the composite transistor is at the emitter electrode of the first transistor. The base electrode of the first transistor and the collector electrode of the second transistor are connected to a node which serves as the equivalent "emitter" electrode of the composite transistor. The emitter electrode of the second transistor is the equivalent "collector" electrode of the composite transistor.

A quasi-complementary push-pull amplifier including a third transistor connected in push-pull with the composite transistor described in the previous paragraph embodies a further aspect of the present invention.

Figure 1:
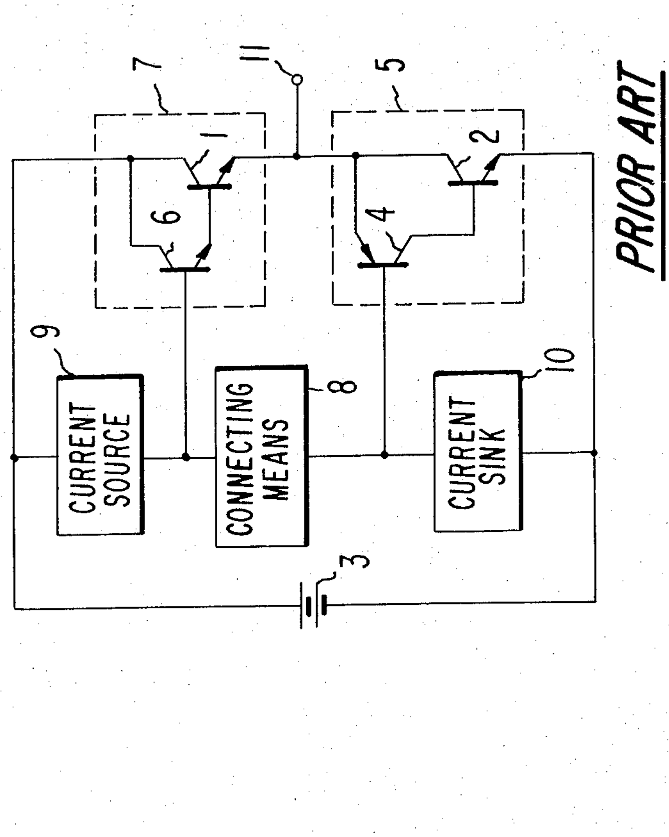
PRIOR ART FIG. 1
Figure 3:
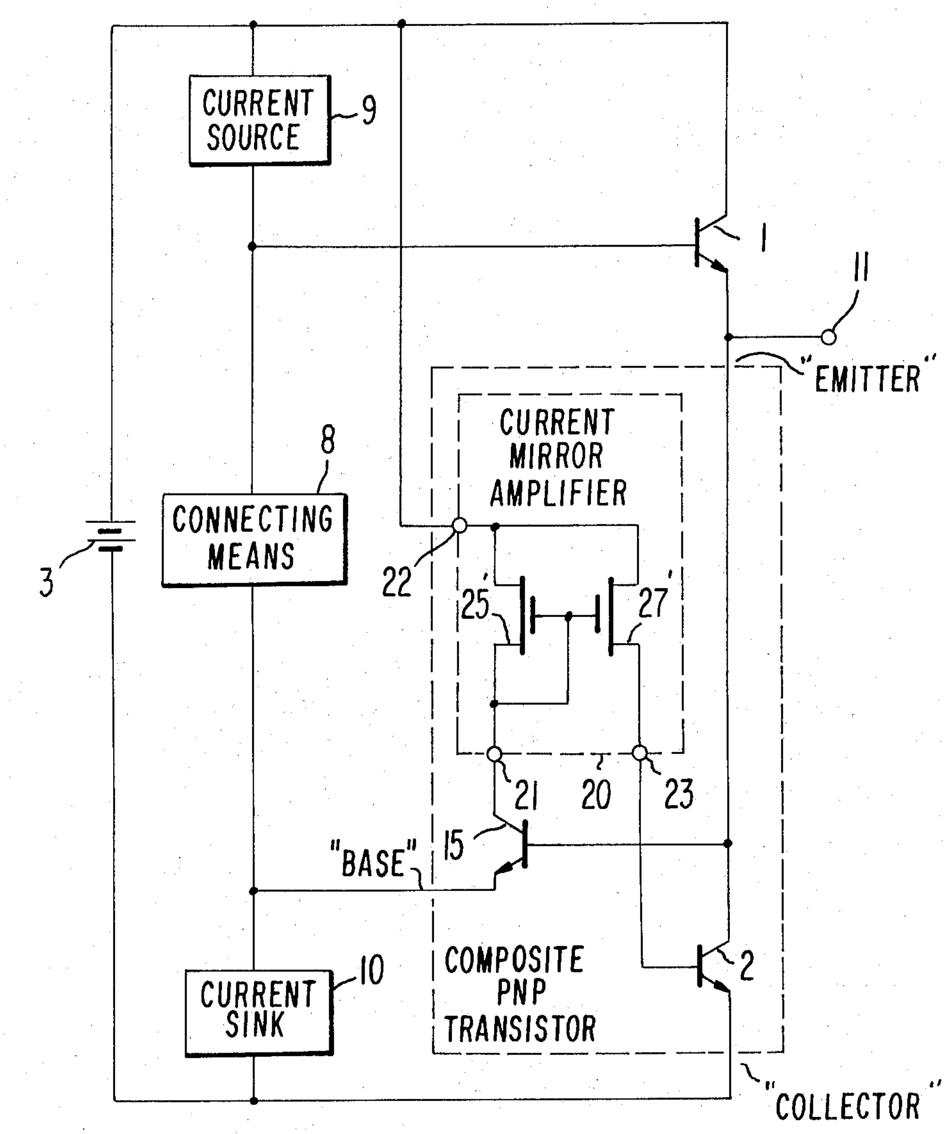

In the drawing:

FIG. 1 is a schematic diagram partially in block form showing the prior art quasi-complementary push-pull amplifier described by Lin in U.S. Pat. No. 2,896,029;

FIG. 2 is a schematic diagram showing an amplifier embodying the present invention, which includes a composite transistor formed of a current mirror employing transistors of one conductivity type and input and output transistors of opposite conductivity type; and FIG. 3 is a schematic diagram of another embodiment of the present invention in which the current mirror is formed of field effect transistors.

Similar elements are identified by the same reference numerals in the various figures.

FIG. 1 shows the prior art Lin amplifier configuration referred to above. In it, transistors 1 and 2 are of the same conductivity type (NPN) and have their collector-to-emitter paths serially connected for application of operating potential from a direct current source 3. PNP transistor 4 has its emitter and collector electrodes connected to the collector and base electrodes, respectively of NPN transistor 2. Transistors 2 and 4 thereby together form what is now commonly conceived of as being a composite transistor shown in phantom outline at 5. This composite transistor 5, formed of opposite conductivity type transistors 4 and 2, exhibits the same conductivity type as its input transistor 4 (shown as being PNP in FIG. 1).

The use of one type of transistor such as 2 in achieving a composite transistor of the opposite conductivity type gives rise to the designation "quasi-complementary." The composite transistor 5 has its equivalent "base" electrode the base electrode of transistor 4, has as its equivalent "collector" electrode the emitter electrode of transistor 2, and has as its equivalent "emitter" electrode the joined emitter electrode of transistor 4 and collector electrode of transistor 2. The current gain of the composite transistor 5 essentially equals the product of the current gains of its component transistors 4 and 2.

A transistor 6 has its emitter and collector electrodes respectively connected to the base and collector electrodes of transistor 1 thereby to form a composite transistor 7 shown in phantom outline. Composite transistor 7 is common denominated as a "Darlington configuration" and is of the same conductivity type as its output transistor 1 (shown as being NPN in FIG. 1). The equivalent current gain of the composite transistor 7 is essentially the product of the current gains of its component transistors 6 and 1.

If the current gains of transistors 4 and 6 are matched, as well as those of transistors 1 and 2, the composite transistors 5 and 7 provide the designer with complementary devices having matched current gains. The input electrodes (bases) of composite transistors 5 and 7 are joined by connecting means 8 to receive, in common, a drive signal current equal to the difference of the current supplied by current source 9 and the current withdrawn by current sink 10. At least one of these latter two currents is modulated in accordance with an input signal. On positive halves of the drive signal current, conduction through composite transistor 7 is increased and conduction through composite transistor 5 is decreased or discontinued, whereby positive current will be delivered via output terminal 11 to any load (none being shown in FIG. 1) thereto connected. On negative halves of the drive signal current conduction through composite transistor 7 is decreased or discontinued and conduction through composite transistor 5 is increased, whereby negative current will be delivered via output terminal 11 to any load thereto connected. Simply stated, composite transistors 5 and 7 provide push-pull amplification of dirve signal applied to their input electrodes (i.e., their equivalent base electrodes).

Over the years, many design variations of the basic Lin configuration have been evolved. There is, for example, a wide range of known designs for the current source 9 and current sink 10. These may be divided into three general classes in which:

1. current source 9 is a constant current source, while current sink 10 withdraws a current which varies in accordance with input signal;

2. current source 9 provides a current which varies in accordance with input signal, while current sink 10 withdraws a constant current; and 3. current source 9 and current sink 10 provide and withdraw, respectively, currents which are in push-pull relationship varying in accordance with input signal.

The design of the connecting means 8 has also received a great deal of attention. The use of a direct connection for connecting means 8 results in Class B operation of the composite transistors 5 and 7. Such operation is marked by a non-linearlity near the cross-over from conduction of one of the devices to the other which causes an insensitivity of output current from terminal 11 to low level drive currents. The introduction of a potential offset into the connecting means 8 just sufficient to bias the base-emitter junctions of transistors 6, 1 and 4 slightly into conduction can provide for operation which is free from cross-over non-linearity in Class B, Class AB or Class A operating modes for devices 5 and 7. Commonly, connecting means 8 contains diodes responsive to quiescent current flow between current source 9 and current sink 10 to provide the desired offset potential. Another scheme is to use the collector-to-emitter path of a transistor connected as a voltage regulator for connecting means 8. The emitter-to-base potential of the regulator transistor can be derived from its emitter-to-collector potential by potential divider network thereby to close a loop regulating the emitter-to-collector potential against its own emitter-to-base offset potential.

The Lin amplifier configuration does not lend itself particularly well to construction in monolithic integrated circuit form for a variety of reasons. A primary reason is that the current gains of transistors of complementary conductivity types are not well matched in an integrated circuit, nor can the relationships between them be predicted with any reasonable degree of accuracy. This shortcoming may be accepted and overall degenerative feedback around the amplifier may be used to mask the dissimilarity of the pushpull stages and to reduce the undesireable even-order harmonic distortion in the output signal.

However, better amplifier design is always to use lower distortion amplifiers with less feedback. This minimizes problems associated with transient phenomena and self-oscillatory tendencies. This also permits greater gains to be attained in fewer stages with improved economy and reliability.

The complementary conductivity transistor 4 is subjected to substantial changes in its emitter-to-collector potential in the Lin amplifier, approaching full operating potential when composite transistor 5 is non-conductive and approaching zero when composite transistor 5 is non-conductive. The lateral structure conventionally used to make complementary transistors produces a transistor which has a current gain which is a pronounced function of its emitter-to-collector potential, even in its most linear range; in the Lin amplifier configuration this becomes a source of substantial even-order harmonic distortion and of intermodulation distortion.

If a metal-oxide semiconductor field-effect transistor device rather than a bipolar transistor with a lateral structure is employed for the complementary conductivity transistor 4, it becomes difficult, as a practical matter, to swing the output signal at terminal 11 over the entire range of the operating potential of supply 3. This is because the MOSFET's which can be presently integrated with bipolar transistors are enhancement types which require substantial source-to-gate potentials to bias them into full conduction. To get full range of output signal swing, the gate of such a FET replacing transistor 4 would have to be swung substantially more negative than the potential appearing at the emitter electrode of transistor 2.

FIG. 2 illustrates a quasi-complementary amplifier embodying the present invention. The composite transistor 7 performs the same function as the like numbered element of FIG. 1. The composite transistor 5′ is constructed in accordance with the present invention and performs the same function as composite transistor 5 of FIG. 1. However, as will be explained in detail below, composite transistor 5′ provides a number of important operating advantages.

The composite transistor 5′ includes an input transistor 15, an output transistor 31 (which may itself be a composite transistor 30, 2, as illustrated in FIG. 2, or a single transistor as shown in FIG. 3), and a current mirror amplifier 20. Current mirror amplifier 20 has a current input terminal 21 connected to the collector of transistor 15 and current output terminal 23 connected to the base of composite transistor 31. The emitter electrode of transistor 15 serves as the base electrode of composite transistor 5′. The joined collector electrodes of transistors 2 and 30 directly connected to the base electrode of transistor 15 serve as the emitter electrode of composite transistor 5′. The emitter electrode of transistor 20 serves as the collector electrode of the composite transistor 5′. The composite transistor 5′ operates as a PNP transistor nothwithstanding the fact that the input transistor 15 and the output composite transistor 31 are formed of NPN devices. Input transistor 15 is operated as a common-base amplifier. The current mirror employs PNP devices. Output transistor 31 is base-driven and in a quasi-complementary amplifier of the type shown in FIG. 2 will operate as a common-collector amplifier. In other configurations, output transistor 31 may alternatively operate as a common-emitter amplifier.

In the FIG. 2 quasi-complementary amplifier, when input signal conditions are such that the current provided by current source 9 exceeds the current withdrawn by current sink 10, positive drive current is applied to the effective base electrode of composite transistor 7 and is available also to the emitter electrode of transistor 15. Positive current can flow into the base electrode of transistor 6 as effective base current for composite transistor 7. However, positive current cannot flow into the emitter electrode of NPN transistor 15 because of the blocking action of its base-emitter junction.

As in the FIG. 1 configuration, the positive drive current applied to the effective base electrode of composite transistor 7 will be amplified to be available at output terminal 11 for application to a subsequent load (not shown). The current gain of composite transistor 7 will be essentially the product of the individual current gains of the cascaded transistors 1, 6 included therewithin. This aspect of the operation of the FIG. 2 amplifier is directly analogous to that of the FIG. 1 Lin amplifier for similar input signal conditions.

When the input signal conditions for the FIG. 2 amplifier are such that the current withdrawn by current sink 10 exceeds that supplied by current source 9, current must be extracted either from the effective base electrode of composite transistor 7 or from the emitter electrode of transistor 15. This may be viewed as the application of negative drive current to these two electrodes. The blocking action of the base-emitter junction of transistor 6 will prevent any effective base current from being drawn from the composite transistor device 7 under these conditions. The demanded current can be drawn from the emitter electrode of transistor 15, however, biasing it into conduction.

The conduction of the base-emitter junction of transistors 15 resembles the conduction of the base-emitter junction of transistor 4 in the FIG. 1 circuit insofar as current source 9, connecting means 8 and current sink 10 are concerned; and the same variations in design of these elements 9, 8 and 10 can be used in the FIG. 2 amplifier as in the FIG. 1 Lin amplifier. The conditions at collector electrodes of transistors 15 and 4 are by no means similar, however. In the FIG. 1 Lin amplifier, transistor 4 is operated, in effect, as a common-emitter amplifier, and its collector current is an inverted and amplified version of the negative drive current applied to its base electrode. In the FIG. 2 amplifier, transistor 15 is operated, in effect, as a common-base amplifier. Its collector current resembles the negative drive current flowing via its emitter electrode both in amplitude and in direction of actual flow.

The required inversion of the drive current preparatory to applying it to the base electrode of transistor 2 is accomplished in a current mirror amplifier 20. This is a three-terminal amplifier having an input terminal 21, a common-terminal 22 and an output terminal 23. The current mirror amplifier has a current gain substantially independent of the current gains of its component devices. A number of such current mirror amplifiers which are adapted for use in the present invention, are known, in addition to that shown in FIG. 2, for instance, from the following United States Patent Applications each of which is assigned to RCA Corporation:

Ser. No. 309,025, Wheatley, filed Nov. 24, 1972;
Ser. No. 318,645, Wittlinger, filed Dec. 26, 1972;
Ser. No. 318,646, Schade, filed Dec. 26, 1972;
Ser. No. 348,723, Ahmed, filed Apr. 6, 1973; and
Ser. No. 387,171, Schade, filed Aug. 9, 1973.

The amplification of the inverted drive current prior to its application to the base electrode of transistor 2 is by means of transistor 30. Transistor 30 forms a composite transistor 31, of the Darlington type together with transistor 2. Composite transistor 31 is base-driven and in the quasi-complementary amplifier shown in FIG. 2 is operated as a common-collector amplifier.

In a typical design of an amplifier embodying the present invention, composite transistors 7 and 31 will have matched current gains. Negative drive current, in such a typical design, is accepted by common-base amplifier transistor 15 which has substantially unity current gain, is inverted by current mirror amplifier 20 which also has substantially unity gain, and then is amplified by a composite transistor 31 before being applied via output terminal 11 to a load (not shown). The amplification of this negative portion of the drive current is the product of the individual current gains of transistors 30 and 2 in the composite transistor 31 and is substantially equal to the amplification of the positive portion of the drive current in composite transistor 7. This symmetry of current gains makes the FIG. 2 amplifier have very low even-order harmonic distortion.

The particular components shown within the phantom block of current mirror amplifier 20 are representative of the basic components of such an amplifier, and their connection illustrates the advantages generally to be obtained as a result of using the present invention when the complementary transistors have lateral structure. The input current withdrawn from current mirror amplifier 20 via its input terminal 21 is principally supplied through resistor 24 and diode-connected transistor 25 from common terminal 22 connected to supply 3. The connection of its base electrode to its collector electrode provides the cathodic terminal of the diode-connected PNP transistor 25; and its emitter electrode, the anodic terminal. Current flow into the emitter electrode of transistor 25 leaves via its collector and base electrodes causing an offset potential thereacross equal to the base-emitter potential required to support that current flow. The IR drop across resistor 24 plus this offset potential are applied to the serial connection of resistor 26 and the base-emitter junction of transistor 27 causing a current therethrough which is related to the current applied to input terminal 21 in the same ratio as the relative conductances of the base-emitter circuits of transistors 27 and 25. Typically, resistors 24 and 26 have matched resistances and transistors 25 and 27 have equal base-emitter junction areas and profiles, in which case the current gain of the current mirror amplifier 20 is minus unity (that is, -1).

The diode connection of transistor 25 by means of the direct interconnection 29 of its base and collector electrodes is, in fact, a negative feedback connection which regulates its emitter-to-collector potential. In some designs, the collector-to-base connection may be made via a common-collector transistor amplifier. But, generally speaking, the emitter-to-collector potentials of transistors (such as 25) in the input circuit of the current mirror amplifier are regulated over a wide range of currents so that their transconductances are not much affected by variations of their emitter-to-collector potential. Since the IR drops across emitter degeneration resistors 24 and 26 are normally only a few hundred millivolts at largest and since the offset potentials across the base-emitter junctions of transistors 30 and 2 are substantially constant and usually small compared to the operating potential afforded by supply 3, the emitter-to-collector potential of transistor 27 shows substantially no variation as a function of drive current. The transconductance of transistor 27 will be unaffected by variations of its emitter-to-collector potential. This is generally true of most known current mirror amplifiers. The freedom of the current gain characteristic of the amplifier constructed in accordance with the present invention from variation due to changes in the gain of each of its complementary conductivity transistors with variation of its emitter-to-collector potential provides a reduction of even order harmonic distortion when the complementary conductivity transistors have lateral structure.

The present invention also provides the important advantage that the frequency responses of the push-pull amplifier stages 7 and 15, 20, 31 are better matched than those of a Lin amplifier constructed in integrated circuit form. This is because Miller effect in a lateral PNP transistor is less pronounced when its base-emitter junction is parallelled with another diode-connected transistor.

In FIG. 3, composite transistors 7 and 31 are replaced by simple transistors 1 and 2, which may in fact, alternatively be composite transistors formed of a plurality of parallelly connected transistors. Current mirror amplifier 20 is shown as comprising field effect transistors (FET's) 25' and 27'. More particularly, field-effect transistors 25' and 27' may be P-type metal-oxide-semiconductor transistors (MOSFET's) of the enhancement type, which are integrable together with bipolar NPN transistors. Such devices are characterized by their source-to-gate potentials having to exceed a threshold potential before device conduction is initiated. This requirement presents no problem insofar as the Class B or Class AB operation of a quasi-complementary push-pull amplifier embodying the present invention is concerned.

The output signal potential at output terminal 11 tends to approach the positive potential at terminal 22 when positive drive current biases transistor 1 into conduction. For this condition, transistor 15 is rendered non-conductive, and the drain-to-gate feedback of transistor 25′ charges the storage capacitance at its drain electrode to reduce its source-to-gate potential and that of transistor 27′ to threshold value. This removes transistors 25′ and 27′ from conduction. As the potential at terminal 11 is clamped within a few tenths of a volt of the potential at terminal 22 by full conduction of transistor 1, the base-to-collector junction of transistor 15 may be forward-biased. This will reduce the source-to-gate potentials of transistors 25′ and 27′ below threshold value, but in their non-conductive state they present a high impedance to the collector electrode of transistor 15 and prevent appreciable current flow through its base-to-collector junction.

Transistors 25′ and 27′ become conductive when the output signal potential at terminal 11 approaches the potential at the emitter electrode of transistor 2 more closely than the potential at terminal 22. For these conditions, conduction of transistor 15 can swing its collector electrode potential negatively, to a potential a few tenths of a volt negative with respect to the output signal potential at terminal 11 which, when the direct operating potential afforded by supply 3 exceeds 6 or 8 volts, assures that sufficient source-to-gate potential can be supplied to transistor 25′ and 27′ to bias them into conduction.

An amplifier embodying the present invention thus possesses the operating feature, which is desirable when using field-effect transistors for complementary conductivity devices, that the input control circuits complementary conduction devices are provided with a large fraction of the operating supply potential when they are called upon to be conductive. This operating feature is not readily available in the Lin amplifier. The fieldeffect transistors can provide the advantage of better frequency response than the lateral PNP transistors, which improves matching between the frequency responses of the push-pull amplifier stages 1 and 15, 20, 2.

In the FIG. 3 configuration elements 15, 20 and 2 can be viewed as comprising a composite transistor functioning analagously to the composite transistor 5 of FIG. 1.

A quasi-complementary amplifier of one of the types described above may exhibit a tendency toward self-oscillation during negative excursions of output signal at terminal 11, if the physical orientation of its component elements is poorly chosen. A number of electrical circuit techniques can be used to reduce any such tendency towards self-oscillation. Means can be used to limit the input signal to a driver amplifier transistor used in current source 9 or current sink 10 to prevent its being operated in a portion of its operating range where its collector impedance is low. Small value capacitors can be judiciously placed in the loop containing transistors 2 and 15 and current mirror amplifier 20 to reduce any oscillatory tendencies by increasing the phase margin in the various negative feedback loops. The common-emitter forward current gain of transistor 15 can be reduced to decrease oscillatory tendencies. This can be done by modifying the processing steps used to form transistor 15, for example, as taught by J. R. Harford in U.S. Pat. application Ser. No. 363,894, filed May 25, 1973, entitled "Integrated Circuit Device" and assigned like the present application to RCA Corporation. Alternatively, the reduction in the common-emitter forward current gain of transistor 15 can be effected by parelleling its base-emitter junction with a semiconductor junction or diode-connected transistor, thereby connecting it as a current mirror amplifier.

The reduction of the common-base amplifier gain of transistor 15 which may accompany the use of the foregoing techniques to reduce its common-emitter amplifier gain can be offset by increasing the gain of the current mirror amplifier 20. In a current amplifier using bipolar transistors such as that of FIG. 2 this would be done by scaling up the conductance of resistor 26 vis-a-vis that of resistor 24 and the area of the base-emitter junction of transistor 27 vis-a-vis that of transistor 25 in the same requisite proportion. In a current amplifier 20 using field-effect transistors, such as that of FIG. 3 this would be done by appropriately scaling the channel dimensions of transistors 25′ and 27′.

The FIG. 2 and FIG. 3 configurations have also been build using a common-base amplifier transistor to couple the collector electrode of transistor 15 to the input terminal 21 of current mirror amplifier 20. This maintains the collector-to-emitter potential of transistor 15 substantially constant during negative swings of output signal potential. This prevents any tendency toward oscillation caused by current gain variations of transistor 15 caused by modulation of its collector-to-emitter potential. This eliminates a mild regenerative effect in the loop comprising elements 15, 20 and 31 which might otherwise aggrevate a tendency toward oscillation on negative swings of output signal.

While the collector and emitter electrodes of transistor 1 are shown directly connected terminals 22 and 11, respectively, in FIGS. 2, 3 and 4 these connections may be made by other direct current conductive means such as resistors used for developing potentials under high output signal current conditions sufficient to activate means for restricting drive current to the base electrode of transistor 1. Similar arrangements may be made with regard to transistor 2 to restrict drive current to the emitter electrode of transistor 15 under high output signal conditions. Amplifiers having such connections are to be considered within the scope of the claim.

While the transistors of the claims are described in the claims in the terms normally associated with bipolar transistors, this should be construed as being necessitated by the restrictions of language. The scope of the claim is to be construed as including the use of field effect transistors having gate, source and drain electrodes corresponding to the use of bipolar transistors having base, emitter and collector electrodes, respectively. The term "transistor" also includes within its scope composite transistors such as a plurality of parallelly connected transistors or certain cascade connections of transistors (e.g., a Darlington cascade). These specific definitions of the term transistor are in no way intended to be restrictive insofar as the application of the doctrine of equivalents is concerned.

What is claimed is:

1. A circuit exhibiting at a first, a second and a third terminals characteristics corresponding to those which would be exhibited by an equivalent transistor of a particular conductivity type at its base, emitter, and collector electrodes, respectively, said circuit comprising:

a first and a second transistors, each of opposite conductivity type to said particular conductivity type, each of said first and said second transistors having a base and an emitter and a collector electrode;

means connecting said first transistor emitter electrode to said first terminal;

means connecting said first transistor base electrode and said second transistor collector electrode each to said second terminal;

means connecting said second transistor emitter electrode to said third terminal; and a current mirror amplifier having an input circuit to which said first transistor collector electrode is connected and an output circuit connected to said second transistor base electrode.

2. A circuit as set forth in claim 1 having in combination therewith to form a quasi-complementary amplifier;

a third transistor of the same type as said second transistor and with similar operating characteristics, said third transistor having a base and an emitter and a collector electrode;

a fourth terminal to which said third transistor collector electrode is connected, said third and said fourth terminals being for connection of direct operating potential therebetween;

means for applying input signal drive current connected to said third transistor base electrode and to said first terminal;

means connecting said third transistor emitter electrode to said second terminal, said second terminal providing an output terminal for supplying an output signal related to said input signal drive current.

3. The combination set forth in claim 2 wherein said first transistor has a common-base amplifier gain of substantially unity and said current mirror amplifier has a current gain of substantially minus unity.

4. The combination set forth in claim 2 wherein said first transistor has a common base amplifier gain of substantially one-half and said current mirror amplifier has a current gain of substantially minus two.

5. A composite transistor of a particular conductivity type, comprising:

first and second transistors of a conductivity type opposite to said particular conductivity type, each of said first and second transistors means having a base and an emitter and collector electrodes, the emitter electrode of said first transistor serving as the base electrode of said composite transistor, the emitter electrode of said second transistor serving as the collector electrode of said composite transistor, and said base electrode of said first transistor and the collector electrode of said second transistor being connected together to serve as the emitter electrode of said composite transistor; and a current mirror amplifier having a current input terminal and a current output terminal, connected at its current input terminal to the collector electrode of said first transistor and at its current output terminal to the base electrode of said second transistor.

6. A composite transistor as set forth in claim 5 wherein said current mirror amplifier comprises:

third and fourth transistors of said particular conductivity type each having a base and an emitter and a collector electrodes, the collector electrodes of said third and said fourth transistors being direct coupled respectively to said current input terminal and to said current output terminal each of said current mirror amplifier, the emitter electrodes of said third and said fourth transistors each being connected to a common terminal to receive an energizing potential, and the base electrodes of said third and said fourth transistors each being direct coupled to said current input terminal.

7. A composite transistor as set forth in claim 5 wherein said current mirror amplifier comprises:

third and fourth transistors of said particular conductivity type each having a gate and a source and a drain electrodes, the drain electrodes of said third and said fourth transistors being direct coupled respectively to said current input terminal and to said current output terminal each of said current mirror amplifier, the source electrodes of said third and said fourth transistors each being connected to a common terminal to receive the energizing potential, and the gate electrodes of said third and said fourth transistors each being direct coupled to said current input terminal.

8. In combination:

input and output transistors of the same conductivity type, each such transistor having base, emitter and collector electrodes;

a current mirror amplifier receptive of the collector current of said input transistor for providing the base current to said output transistor;

a signal input terminal at the emitter electrode of said input transistor;

a signal output terminal connected to the base electrode of said input transistor and the collector electrode of said output transistor; and a common terminal at the emitter electrode of said output transistor.

9. A composite transistor of a particular conductivity type comprising:

first and second transistors of a conductivity type opposite to said particular conductivity type, each having a base and an emitter and a collector electrodes, means for applying input signal to said first transistor so as to operate it as a common-base amplifier;

a current mirror amplifier responsive to collector current of said first transistor to supply base current to said second transistor, thereby to form a cascade connection of said common base amplifier followed by said current mirror amplifier followed by base-driven said second transistor.

* * * * *